US009852953B2

(12) United States Patent
Mathew

(10) Patent No.: US 9,852,953 B2
(45) Date of Patent: Dec. 26, 2017

(54) CMOS FABRICATION

(71) Applicant: Micron Technology, Inc., Boise, ID (US)

(72) Inventor: Suraj Mathew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/942,693

(22) Filed: Nov. 16, 2015

(65) Prior Publication Data

US 2016/0071775 A1 Mar. 10, 2016

Related U.S. Application Data

(62) Division of application No. 14/470,526, filed on Aug. 27, 2014, now Pat. No. 9,214,394, which is a division of application No. 11/408,112, filed on Apr. 20, 2006, now Pat. No. 8,823,108, which is a division of
(Continued)

(51) Int. Cl.
*H01L 21/8238* (2006.01)
*H01L 29/66* (2006.01)
*H01L 29/78* (2006.01)
*H01L 21/265* (2006.01)
(Continued)

(52) U.S. Cl.
CPC .... *H01L 21/823807* (2013.01); *H01L 21/265* (2013.01); *H01L 21/266* (2013.01); *H01L 21/823814* (2013.01); *H01L 27/0928* (2013.01); *H01L 29/6653* (2013.01); *H01L 29/6659* (2013.01); *H01L 29/66492* (2013.01); *H01L 29/7833* (2013.01)

(58) Field of Classification Search
CPC ......... H01L 21/8238; H01L 21/823807; H01L 21/823814; H01L 21/823842; H01L 29/7833
See application file for complete search history.

(56) References Cited

U.S. PATENT DOCUMENTS

| | | |
|---|---|---|
| 4,422,885 A | 12/1983 | Brower et al. |
| 4,757,026 A | 7/1988 | Woo et al. |
| 4,818,714 A | 4/1989 | Haskell |

(Continued)

OTHER PUBLICATIONS

Pohm et al., "Experimental and analytical properties of 0.2 micron wide, multi-layer, GMR, memory elements," Transactions on Magnetics, Sep. 1996, pp. 4645-4647, vol. 32, No. 5.
(Continued)

*Primary Examiner* — Hoai V Pham
(74) *Attorney, Agent, or Firm* — Wells St. John P.S.

(57) ABSTRACT

A method of manufacturing a memory device includes an nMOS region and a pMOS region in a substrate. A first gate is defined within the nMOS region, and a second gate is defined in the pMOS region. Disposable spacers are simultaneously defined about the first and second gates. The nMOS and pMOS regions are selectively masked, one at a time, and LDD and Halo implants performed using the same masks as the source/drain implants for each region, by etching back spacers between source/drain implant and LDD/Halo implants. All transistor doping steps, including enhancement, gate and well doping, can be performed using a single mask for each of the nMOS and pMOS regions. Channel length can also be tailored by trimming spacers in one of the regions prior to source/drain doping.

9 Claims, 7 Drawing Sheets

Related U.S. Application Data application No. 11/152,988, filed on Jun. 14, 2005, now Pat. No. 7,858,458.

(51) Int. Cl.
  *H01L 21/266* (2006.01)
  *H01L 27/092* (2006.01)

(56) References Cited

U.S. PATENT DOCUMENTS

| | | |
|---|---|---|
| 5,015,595 A | 5/1991 | Wollesen |
| 5,024,959 A | 6/1991 | Pfiester |
| 5,296,401 A | 3/1994 | Mitsui et al. |
| 5,328,810 A | 7/1994 | Lowrey et al. |
| 5,405,791 A | 4/1995 | Ahmad et al. |
| 5,460,993 A | 10/1995 | Hsu et al. |
| 5,512,771 A | 4/1996 | Hiroki et al. |
| 5,604,370 A | 2/1997 | Mehta et al. |
| 5,638,318 A | 6/1997 | Seyyedy |
| 5,677,865 A | 10/1997 | Seyyedy |
| 5,680,344 A | 10/1997 | Seyyedy |
| 5,682,048 A | 10/1997 | Shinohara et al. |
| 5,700,733 A | 12/1997 | Manning |
| 5,757,083 A | 5/1998 | Yang |
| 5,766,991 A | 6/1998 | Chen |
| 5,789,269 A | 8/1998 | Mehta et al. |
| 5,882,973 A | 3/1999 | Gardner et al. |
| 5,895,238 A | 4/1999 | Mitani |
| 5,913,116 A | 6/1999 | Gardner et al. |
| 5,963,803 A | 10/1999 | Dawson et al. |
| 5,972,764 A | 10/1999 | Huang et al. |
| 5,973,363 A | 10/1999 | Staab et al. |
| 5,994,743 A | 11/1999 | Masuoka |
| 6,005,800 A | 12/1999 | Koch et al. |
| 6,037,230 A | 3/2000 | Holloway |
| 6,087,210 A | 7/2000 | Sohn |
| 6,093,594 A | 7/2000 | Yeap et al. |
| 6,111,782 A | 8/2000 | Sakakima et al. |
| 6,124,610 A | 9/2000 | Cheek et al. |
| 6,141,204 A | 10/2000 | Schuegraf et al. |
| 6,150,211 A | 11/2000 | Zahurak |
| 6,157,064 A | 12/2000 | Huang |
| 6,165,833 A | 12/2000 | Parekh et al. |
| 6,175,146 B1 | 1/2001 | Lane et al. |
| 6,187,620 B1 | 2/2001 | Fulford et al. |
| 6,303,432 B1 | 10/2001 | Horita et al. |
| 6,344,396 B1 | 2/2002 | Ishida et al. |
| 6,424,561 B1 | 7/2002 | Li et al. |
| 6,486,516 B1 | 11/2002 | Hachisuka |
| 6,506,642 B1 | 1/2003 | Luning et al. |
| 6,541,328 B2 | 4/2003 | Whang et al. |
| 6,545,904 B2 | 4/2003 | Tran |
| 6,573,172 B1 | 6/2003 | En et al. |
| 6,610,565 B2 | 8/2003 | Kim et al. |
| 6,661,061 B1 | 12/2003 | Gardner et al. |
| 6,670,227 B1 | 12/2003 | Thio et al. |
| 6,673,705 B2 | 1/2004 | Miyashita |
| 6,696,334 B1 | 2/2004 | Hellig et al. |
| 6,699,763 B2 | 3/2004 | Grider et al. |
| 6,825,529 B2 | 11/2004 | Chidambarrao et al. |
| 6,885,084 B2 | 4/2005 | Murthy et al. |
| 6,891,192 B2 | 5/2005 | Chen et al. |
| 6,908,800 B1 | 6/2005 | Kim et al. |
| 6,946,709 B2 | 9/2005 | Yang |
| 7,015,082 B2 | 3/2006 | Doris et al. |
| 7,015,089 B2 | 3/2006 | Hsu et al. |
| 7,022,561 B2 | 4/2006 | Huang et al. |
| 7,030,464 B2 | 4/2006 | Masuoka et al. |
| 7,034,366 B2 | 4/2006 | Watanabe et al. |
| 7,042,047 B2 | 5/2006 | Eppich |
| 7,052,964 B2 | 5/2006 | Yeo et al. |
| 7,098,099 B1 | 8/2006 | Hornung et al. |
| 7,105,089 B2 | 9/2006 | Fanselow et al. |
| 7,112,495 B2 | 9/2006 | Ko et al. |
| 7,193,254 B2 | 3/2007 | Chan et al. |
| 7,214,629 B1 | 5/2007 | Luo et al. |
| 7,214,989 B2 | 5/2007 | Ushiroda et al. |
| 7,238,580 B2 | 7/2007 | Orlowski et al. |
| 7,244,644 B2 | 7/2007 | Zhu et al. |
| 7,572,692 B2 | 8/2009 | Yang |
| 2002/0056887 A1 | 5/2002 | Horstmann et al. |
| 2002/0079557 A1 | 6/2002 | Ahn et al. |
| 2003/0040158 A1 | 2/2003 | Saitoh |
| 2003/0094636 A1 | 5/2003 | Maeda |
| 2003/0157774 A1 | 8/2003 | Tominari et al. |
| 2003/0176033 A1 | 9/2003 | Grider et al. |
| 2003/0207555 A1 | 11/2003 | Takayanagi et al. |
| 2004/0043549 A1 | 3/2004 | Sayama et al. |
| 2004/0063264 A1* | 4/2004 | Zheng ............ H01L 21/823814 438/199 |
| 2004/0104405 A1 | 6/2004 | Huang et al. |
| 2004/0147137 A1 | 7/2004 | Hiraiwa et al. |
| 2004/0180504 A1 | 9/2004 | Lee et al. |
| 2004/0262784 A1 | 12/2004 | Doris et al. |
| 2005/0012149 A1 | 1/2005 | Liu et al. |
| 2005/0026373 A1* | 2/2005 | Popp ............... H01L 21/82345 438/275 |
| 2005/0029601 A1 | 2/2005 | Chen et al. |
| 2005/0051866 A1 | 3/2005 | Wang et al. |
| 2005/0112854 A1 | 5/2005 | Ito et al. |
| 2005/0136606 A1 | 6/2005 | Rulke et al. |
| 2005/0139930 A1 | 6/2005 | Chidambarrao et al. |
| 2005/0164443 A1 | 7/2005 | Kim et al. |
| 2005/0202656 A1 | 9/2005 | Ito et al. |
| 2005/0263826 A1 | 12/2005 | Yang |
| 2005/0266631 A1 | 12/2005 | Kim et al. |
| 2006/0125006 A1 | 6/2006 | Harada et al. |
| 2006/0157795 A1 | 7/2006 | Chen et al. |
| 2006/0214243 A1 | 9/2006 | Sakoda et al. |
| 2006/0286740 A1 | 12/2006 | Lin et al. |
| 2007/0001233 A1 | 1/2007 | Schwan et al. |
| 2007/0024321 A1 | 2/2007 | Lin et al. |
| 2007/0090487 A1 | 4/2007 | Babich et al. |
| 2007/0122955 A1 | 5/2007 | Luo et al. |
| 2007/0132018 A1 | 6/2007 | Kotani et al. |
| 2007/0196973 A1 | 8/2007 | Park |

OTHER PUBLICATIONS

U.S. Appl. No. 11/152,988 Final Office Action, dated Mar. 21, 2008, 20 pages.

U.S. Appl. No. 11/152,988 Notice of Allowance, dated Aug. 23, 2010, 13 pages.

* cited by examiner

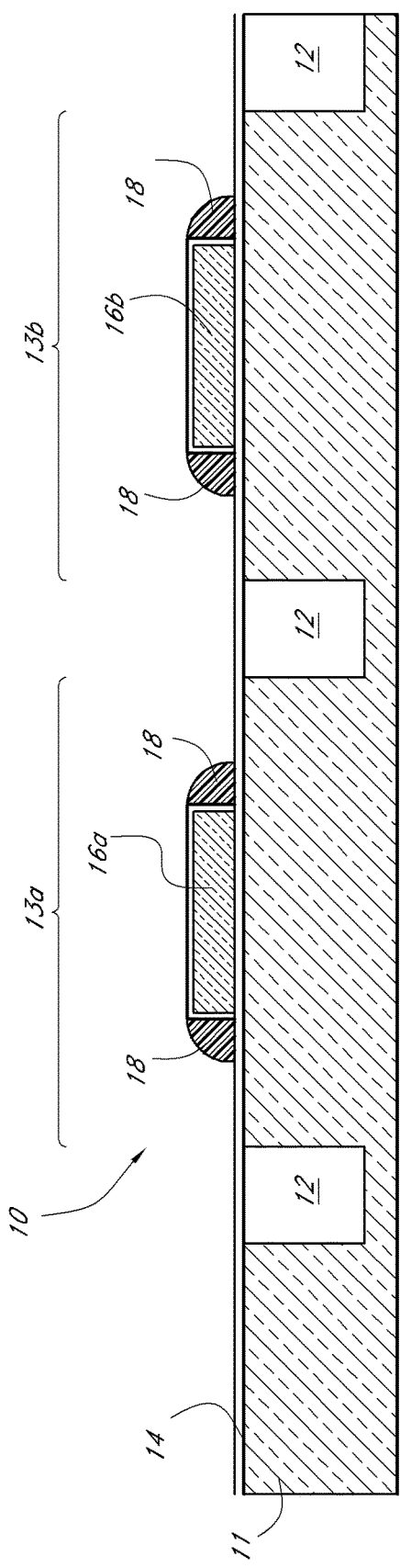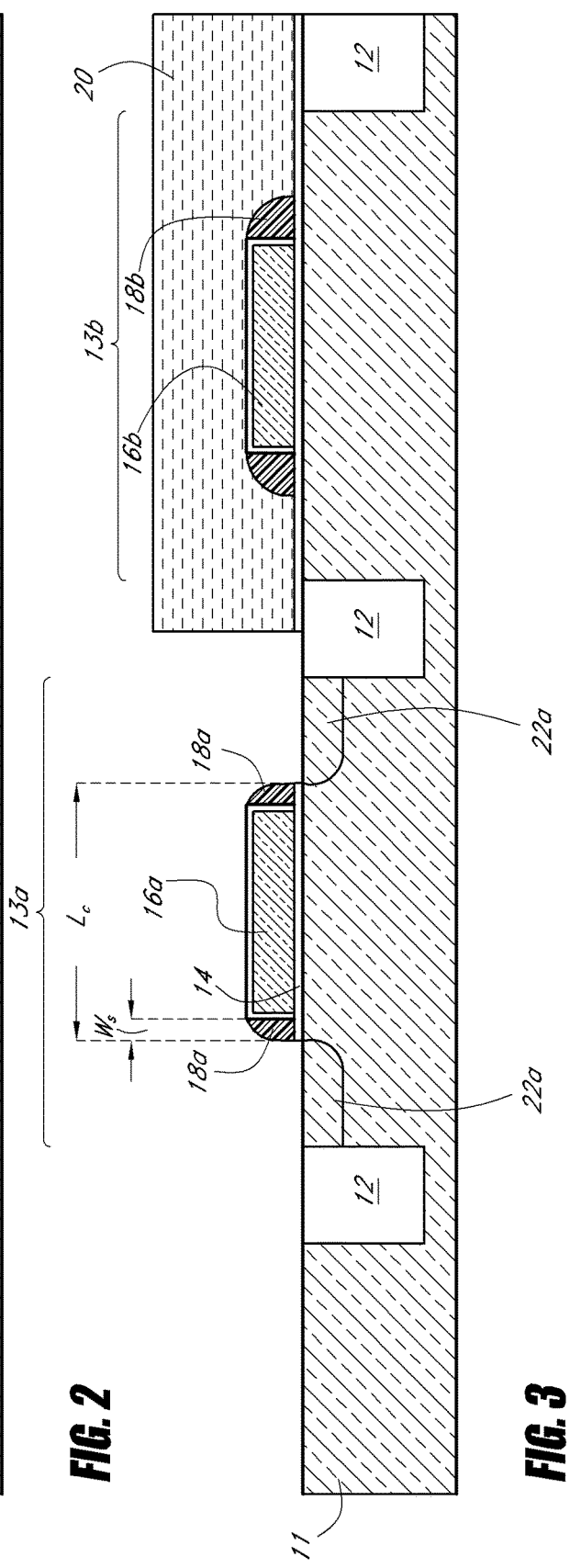
FIG. 2
FIG. 3

US 9,852,953 B2

CMOS FABRICATION

PRIORITY APPLICATION

This application is a divisional of U.S. patent application Ser. No. 14/470,526 (filed 27 Aug. 2014), which is a divisional of U.S. patent application Ser. No. 11/408,112 (filed 20 Apr. 2006), issued 2 Sep. 2014 as U.S. Pat. No. 8,823,108, which is a divisional of U.S. patent application Ser. No. 11/152,988 (filed 14 Jun. 2005), issued 28 Dec. 2010 as U.S. Pat. No. 7,858,458, the entire disclosures of which are hereby incorporated by reference herein in their entireties.

BACKGROUND OF THE INVENTION

Field of the Invention

The invention relates generally to integrated circuit design and, more particularly, to a process for defining complementary metal oxide semiconductor ("CMOS") transistors.

Description of the Related Art

Integrated circuits are typically produced according to a series of complex fabrication steps including deposition, masking, etching and doping steps. The complexity of the fabrication greatly increases the cost of the integrated circuits, and often results in relatively low manufacturing efficiency.

For example, for memory circuits or devices, such as dynamic random access memories (DRAMs), static random access memories (SRAMs) and ferroelectric (FE) memories, the fabrication of the CMOS logic around the periphery traditionally comprises a number of relatively time-consuming and expensive masking steps.

First, a mask is used to define the active areas of the transistors in the CMOS by shallow trench isolation (STI). According to some manufacturing methods, this same masking stage may be used to simultaneously define active areas in the array by STI. Next, a gate oxide is defined, typically in both the periphery and array. Using one mask for the n-channel metal oxide semiconductors (nMOS) and another mask for the p-channel metal oxide semiconductors (pMOS), the well, n-channel enhancement implants and polysilicon workfunction implants are defined in the next step.

The polysilicon for forming the gates in the CMOS may then be formed using another mask. The lightly doped drain (LDD) implant and Halo implant (or pocket implant, as it is sometimes referred to) may then be formed around the CMOS gates using one mask for the nMOS, one mask for the pMOS, and yet another mask for the array.

Spacers are then typically formed along the vertical sidewalls of gate electrodes of both the periphery and array. The source and drain regions for the transistors may then be doped using a mask for each of the nMOS and pMOS regions. Finally, a low k gap fill oxide is deposited along the top of the memory device, and the device undergoes rapid thermal processing (RTP) for dopant activation. The transistors and other circuit elements of the array and periphery are thereby defined, and lines may then be connected thereto according to other steps well known to those of skill in the art.

As is clear from the description above, a typical CMOS fabrication process necessitates the use of many masks, and is a complex, time-consuming process. An exemplary CMOS fabrication process flow as described above, for example, employs eight (8) masks from definition of field isolation until transistor source/drain doping for each of the nMOS and pMOS regions. There is a need, therefore, for a less complex manufacturing technique that would use fewer masks, and that would also have an improved yield in comparison to traditional techniques.

SUMMARY OF THE INVENTION

According to one aspect of the invention, a process is provided for forming a memory device. The method includes patterning gates in nMOS and pMOS regions for CMOS circuits. The pMOS regions are masked with a first mask. Source/drain doping and supplemental doping between source/drain regions and the gates are conducted in the nMOS regions while the pMOS regions remain masked with the first mask. The nMOS regions are masked with a second mask. Source/drain doping and supplemental doping between source drain regions and the gates are conducted in the pMOS regions while the nMOS regions remain masked with the second mask. Exemplary supplemental doping includes lightly doped drain (LDD) and pocket or Halo implants.

According to another aspect of the invention, a method of manufacturing a memory device is disclosed. The method includes providing a substrate and defining a pMOS region and an nMOS region in the substrate. A first gate is defined in the nMOS region, and a second gate is defined in the pMOS region. First and second spacers are formed over the first and second gates, respectively. The nMOS and pMOS regions are selectively masked, and at least a portion of the first spacers is etched back from the first gate while the pMOS region is masked.

According to another aspect of the invention, a method is provided for manufacturing a memory device. The method includes providing a substrate and defining at least two active areas within the substrate, where at least one of said active areas comprises an nMOS region, and at least another of said active areas comprising a pMOS region. A first gate is patterned within the nMOS region and a second gate is patterned within the pMOS region. First disposable spacers are formed on the first gate and second disposable spacers are simultaneously formed on the second gate. The first disposable spacers are trimmed to be smaller than a width of the second disposable spacer.

According to another aspect of the invention, a method of fabricating CMOS circuits includes defining field isolation, patterning CMOS gates and conducting complete CMOS transistor doping using six or fewer masks.

According to another aspect of the invention, an integrated circuit is provided. The integrated circuit comprises a substrate, an nMOS gate over an n-channel in the substrate, and a pMOS gate over a p-channel in the substrate. The nMOS and pMOS gates have approximately the same widths while the n-channel is shorter than the pMOS channel.

According to another embodiment of the invention, a system comprising a CMOS circuit is provided. The CMOS circuit comprises a substrate and a CMOS transistor gate formed integrally with the substrate. Source/drain regions are formed within the substrate near the gate, and lightly doped drain (LDD) regions are formed at least partially between the source/drain regions and the gate. A gap-fill oxide, with a dielectric constant of less than about 3.5 directly contacts sidewalls of the gate.

BRIEF DESCRIPTION OF THE DRAWINGS

These and other aspects of the invention will be better understood from the detailed description of the preferred embodiments and from the appended drawings, which are meant to illustrate and not to limit the invention, and in which:

FIG. 2 illustrates a cross-sectional view of a portion of a memory device within which nMOS and pMOS transistors may be formed according to a preferred embodiment of the present invention.

FIG. 3 illustrates a cross-sectional view of the device of FIG. 2 after a mask step, optional spacer trim in n-channel areas, n+ implant and n-channel enhancements implant.

FIG. 6 illustrates a cross-sectional view of the device of FIG. 4 after a second mask step, optional spacer trim in p-channel areas, p+ implant and p-channel enhancements implant.

DETAILED DESCRIPTION OF THE PREFERRED EMBODIMENTS

The preferred embodiments of the present invention are described in a DRAM environment. While the circuit design of these preferred embodiments may be incorporated into any integrated circuit that includes CMOS, such as processors, specialty chips or volatile or non-volatile memory devices, such as DRAM, SRAM, and flash memory, they have particular utility in the integrated circuit memory device context. Of course, larger circuits, computers, devices and systems incorporating the integrated circuits described herein are also contemplated.

Figure 1:
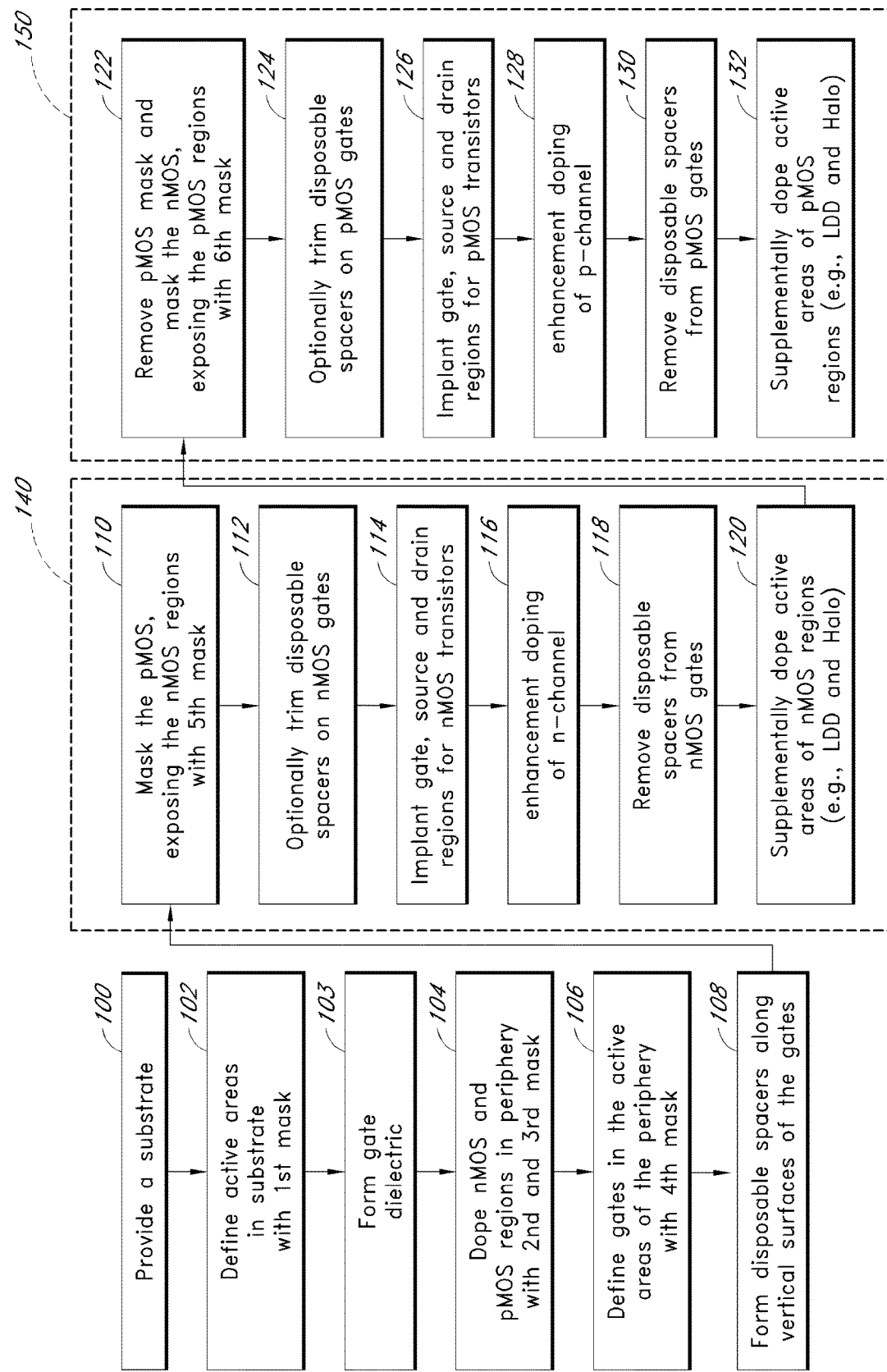
FIG. 1 is a flow chart illustrating one process for fabricating CMOS circuits according to a preferred embodiment of the present invention.

A process for fabricating one CMOS region, in a memory device and particularly in DRAM according to one embodiment of the present invention, is illustrated in FIG. 1, and described in greater detail below. FIG. 1 shows a flow chart illustrating one preferred process for fabricating a CMOS region. The steps illustrated in this flow chart are preferably performed in the illustrated order; however, as will be understood by those skilled in the art, they may also be performed in other sequences and various substitutions and replacements may be made. In the discussion below, some of the possible substitutions and replacements will be discussed in further detail. The description below simultaneously makes reference to the process flow of FIG. 1 and the structures shown in FIGS. 2-8.

A substrate is first provided 100 (FIG. 1). The provided substrate 11 is illustrated in FIG. 2 after some initial processing (steps 100-108 of FIG. 1). FIG. 2 shows a cross-sectional view of a portion of the periphery of a memory device 10, wherein the logic of the memory device is generally located. This graphical layout illustrates one pMOS active area and one nMOS active area of logic in the periphery. It will be understood that the integrated circuit includes many such pMOS and nMOS active areas, simultaneously processed on a wafer that will later be diced into chips or dies. Of course, many of these components would be indistinguishable in a purely visual representation, and some of the components shown in FIG. 2 and subsequent figures are artificially distinguished from other materials in order to highlight their functionality. The memory device 10 is preferably built on and in the substrate 11, which forms the lowest level of semiconductor material in which electrical devices are formed. The substrate 11 typically comprises silicon, e.g., epitaxial silicon or the upper surface of a silicon wafer. Of course, other suitable materials (e.g., other group III-V elements) may also be used, as is well-known to those skilled in the art.

In one embodiment, active areas may then be defined 102 (FIG. 1) in the substrate 11 by field isolation, in the form of shallow trench isolation (STI) in the illustrated embodiment. Preferably, the active areas in both the array and periphery are defined by STI. Typically, a hard mask material (e.g., silicon nitride) is first laid down over the substrate 11, and a photoresist layer is deposited over the hard mask. Standard photolithographic techniques may then be used to form a pattern of trenches through the photoresist layer, and the hard mask layer may then be anisotropically etched through the patterned photoresist to obtain a plurality of trenches through these top two layers. The photoresist layer may then be removed by conventional techniques, such as by using an oxygen-based plasma. The trenches may then be extended by a selective etch that removes the exposed silicon forming the substrate 11, thereby forming trenches within the memory device 10. These trenches are then filled with an insulator, such as an oxide. The insulator may be blanket deposited over the entire memory device 10, and then the device may be planarized by any of a number of methods, including, for example, chemical-mechanical polishing ("CMP") stopping on the hard mask. The resulting isolation trenches 12 may be seen in FIG. 2, separating the n-channel regions 13a from the p-channel regions 13b. As will be understood by those skilled in the art, step 102 thereby comprehends the use of a first mask (not shown) to define the active areas.

As shown in FIG. 2, a thin gate dielectric layer 14 may then be formed 103 (FIG. 1) over the active regions of the memory device 10. This dielectric layer 14 comprises silicon oxide in a preferred embodiment, although other dielectric materials (e.g., high k layers such as $Ta_2O_5$, $HfO_2$ or $ZrO_2$) may be used. In one embodiment, the dielectric layer 14 is formed by thermal oxidation of the exposed silicon substrate 11.

In a preferred embodiment, the nMOS and pMOS regions in the periphery may then be doped, defining the transistor wells within these regions. As will be well understood by those skilled in the art, in the nMOS regions, a p-well is formed by doping 104 (FIG. 1) the silicon substrate 11 in that region to form a relatively lightly doped p-type semiconductor. In one preferred embodiment, the nMOS regions are doped with boron. Meanwhile, the pMOS regions are doped to form an n-type semiconductor or n-wells. In a preferred embodiment, the pMOS regions are doped with phosphorous. In one preferred process implementation, each of these steps uses one mask, and so two more masks (not shown) are used in step 104 to define the wells. The process of masking may be performed in a number of ways but is preferably performed as described above, using a photoresist layer patterned according to conventional photolithographic techniques. This lithographic pattern can optionally be transferred to a hard mask to expose the surface of the device 10, thereby opening selected areas of the device 10 for further processing steps, such that the wells may be doped through the masks. After each masking step, the photoresist and any hard mask layers are preferably removed. In addition to doping the wells, these masks can be used for channel enhancement and polysilicon workfunction implants.

In another embodiment, (see FIG. 10 and related description below) the second and third masks can be omitted and well implants can instead be performed at the same time as other doping steps using the fifth and sixth masks (which become the third and fourth masks) described below.

Returning to the embodiment of FIG. 1, the gates 16 may then be patterned or defined 106 in the periphery using a fourth mask. These gates 16 are formed of a conductive material and initially comprise undoped polysilicon in one preferred embodiment. Preferably the gates in the array (not shown) of the memory device 10 are patterned at a subsequent processing step. In further detail, polysilicon may first be blanket deposited over at least the periphery. Then, by a series of photolithographic steps, the polysilicon may be etched back to the gate dielectric layer 14 except in certain lithographically defined regions, where the polysilicon forms gates 16. Preferably the polysilicon is blanket deposited over periphery and array (not shown) regions, but is patterned at this stage 106 only over the periphery. This is because the CMOS gates for the illustrated process employ a bare, uncovered polysilicon, whereas memory array gates preferably include strapping metal or silicide and protective capping layers. A separate mask is used at a later stage to pattern gates in the memory array regions after optional metal or silicide and cap layer formation. In other embodiments, the gates 16a, 16b may be metallic, as will be well understood by those skilled in the art. As will be better understood from the discussion below, the thickness of the polysilicon layer is selected to be greater than or equal to the desired source/drain junction depth.

Preferably, the gates 16 in both nMOS and pMOS regions 13a, 13b have the same width. Preferably, the gate length is less than 0.5 µm, and more preferably 0.1 µm. As will be seen below, despite the fact that the gate widths are the same for both nMOS and pMOS regions, the process described herein can produce effectively different channel lengths by modulating the spacer width rather than the gate width. As illustrated, the gates 16 are patterned without any capping layer, such that the polysilicon remains exposed on top.

Disposable spacers 18 (FIG. 2) are then formed 108 (FIG. 1) along the vertical surfaces of the gates 16. First, a conformal layer of spacer material is deposited to cover the top surface of the memory device 10. Preferably, the spacer material can be selectively etched with respect to the substrate 11 and the insulator layer 14, and the substrate 11 and the insulator layer 14 can each be selectively etched with respect to the spacer material. In the illustrated embodiment, the spacer material comprises a relatively low density material, such as a TEOS oxide, such that it can be readily stripped (selectively) at a later stage. Of course, in other embodiments, the spacer material may comprise other well-known spacer materials, such as silicon nitride; however, such materials are less desirable for the disposable spacer function. The spacer material may be deposited using any suitable deposition process, such as, for example, chemical vapor deposition (CVD) or physical vapor deposition (PVD).

After laying the spacer material over the vertical and horizontal surfaces of the memory device 10, an anisotropic etch is used to preferentially remove the spacer material from the horizontal surfaces in a directional spacer etch. Thus, the spacer material is formed into the disposable spacers 18, i.e., material extending from the sidewalls of another material. As shown in FIG. 2, the spacers 18 are formed along the vertical surfaces of the CMOS gates 16. In a preferred embodiment, the width of the spacers 18 to which they are initially etched back is approximately the same for what will become both the nMOS and pMOS gates. Thus, no masking step is employed at this stage and the spacers 18 are initially uniformly thick in nMOS and pMOS regions.

In one embodiment, a fifth mask is then used to cover 110 (FIG. 1) the pMOS, while exposing the nMOS regions for subsequent processing. This mask 20 is illustrated in FIG. 3. Optionally, the spacers 18a surrounding the nMOS gates 16a may then be partially etched back or trimmed 112 (FIG. 1), narrowing their width $W_S$ as illustrated in FIG. 3. As is well understood by those of skill in the art, the spacers for n-channel gates 16a are preferably smaller than those for p-channel gates 16b because p-channel should be separated from their respective sources and drains by a greater distance, since n-channel implants are less prone to diffusion. The p-channel has an effective channel length that is defined by the width of the gate 16b plus approximately two times the width of the spacers 18b. The n-channel length $L_C$ is more narrow, since it is defined in the illustrated embodiment by an identical gate width plus two times the width of the spacers 18a, which are trimmed relative to spacers 18b. Thus the p-channel is preferably between more than 10% greater than the n-channel length. More preferably, the effective p-channel length is 10-30% and most preferably 15-20% longer than the n-channel.

For example, in one embodiment, the effective channel length under the p-channel gate 16b may be between 600 Å and 800 Å, while the effective channel length under the n-channel gate 16a may be between 400 Å and 800 Å. In such an embodiment, the width of the spacers $W_S$, as initially formed, should preferably be sufficient to generate an effective channel length of the nMOS and pMOS gates 16 of at least 800 Å. In a subsequent processing step, the spacers 18a surrounding the n-channel gates 16a may be etched back to achieve the desired effective channel length of the n-channel. This etch back may be performed by any of a number of conventional methods.

At step 114 (FIG. 1), once the spacers 18a and n-channel gate 16a form an appropriate effective channel length, the source and drain regions 22a are implanted using the same mask 20, as shown in FIG. 3. As is known in the art, the source and drain regions in the nMOS will preferably be doped (e.g., with phosphorous) to form an n-type semiconducting region in the p-well. In another embodiment, other elements may be used to dope the substrate 11 in order to form an n-type semiconductor.

In the preferred embodiment, because of the location of the spacers 18a along the sides of the n-channel gate 16a, the source and drain regions 22a may be created a distance $W_S$ away from the n-channel gate 16a.

The same doping step 114 (FIG. 1) dopes the illustrated exposed nMOS gates 16a during this stage of CMOS processing, thus setting the workfunction and differentiating the nMOS gates 16a from the pMOS gates 16b. Thus, with the spacers 18 and mask 20 in place, the entire exposed (unmasked) surface of the periphery of the device 10 may be doped with an n-type semiconductor dopant, thereby defining the nMOS gates 16a, sources and drains 22a in one step. The lack of a capping layer on the gates 16a facilitates this simultaneous doping of the gate 16a with the source/drain regions 22a. As noted above, the thickness of the polysilicon layer as deposited is selected to be greater than or equal to the desired junction depth, such that the doping 114 does not penetrate into the channel region, but rather remains within the gate above the gate dielectric. In another embodiment (not shown), the gate can include a barrier layer above the gate dielectric to prevent diffusion or implantation of the gate from reaching the underlying channel.

With the same mask 20 in place, the n-channel may also be enhanced during this stage of CMOS processing, step 116. The n-channel is enhanced with p-type doping, (e.g., boron). This enhancement doping is also commonly called a Taylor implant, and need not be performed for some applications. This step, while performed in the illustrated embodiment with the trimmed spacers 18a along the gates 16a, may instead be performed with the spacers 18 in place, or after complete removal of the spacers 18/18a.

Figure 4:
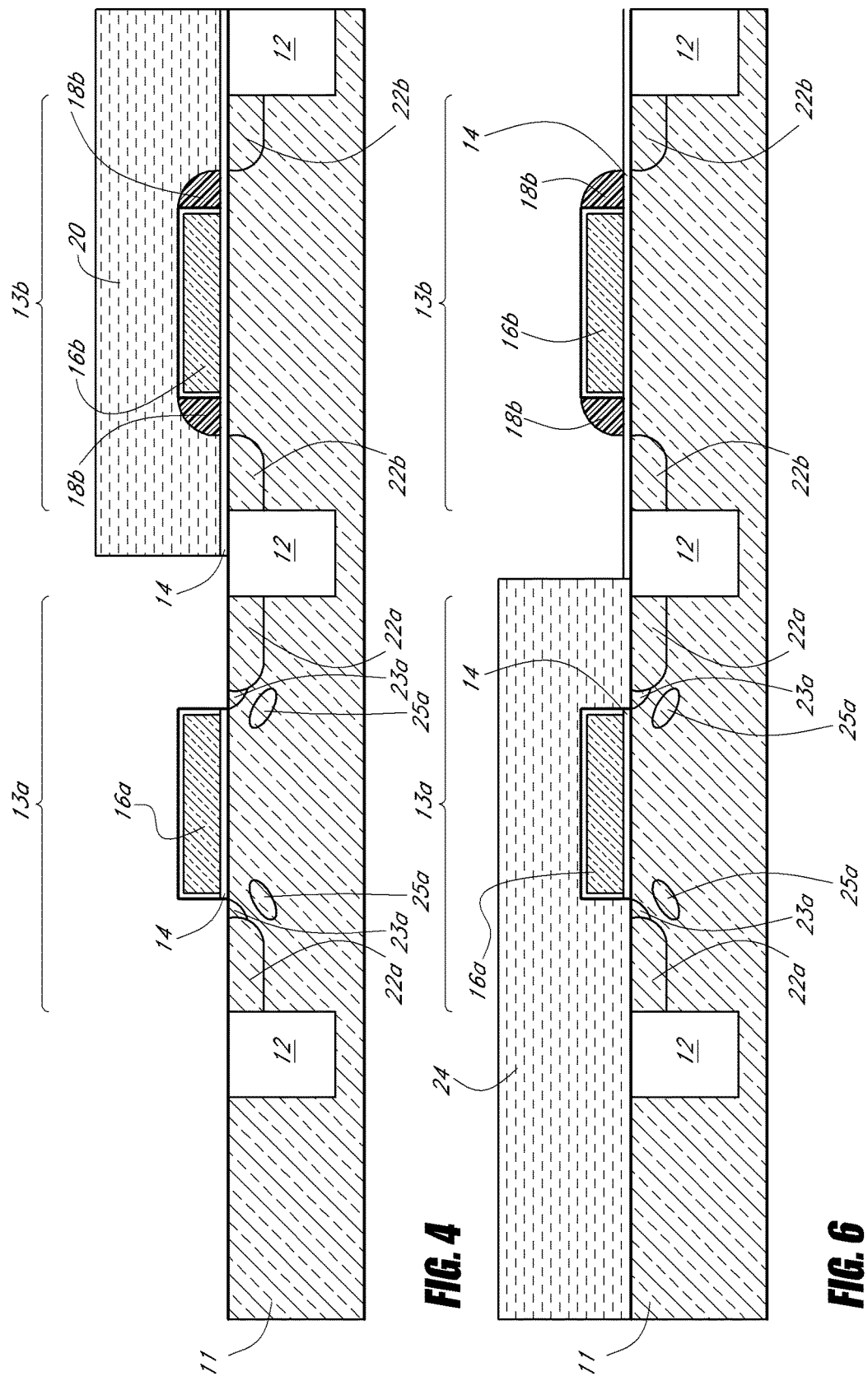
FIG. 4 illustrates a cross-sectional view of the device of FIG. 3 after spacer removal in n-channel areas, LDD implant and Halo implant.

With the same mask 20 in place, after completion of the above steps (or before, as discussed above), the spacers 18a adjacent the walls of the n-channel gates 16a are preferably removed 118 (FIG. 1), as shown in FIG. 4. In a preferred embodiment, this removal may be performed by a buffered oxide etch or dip, preferentially removing TEOS without harm to the mask or other exposed structures. Choice of the spacer material relative to surrounding materials facilitates the removal. By this removal, access is achieved to those portions of the substrate 11 previously covered by the width, $W_S$, of the spacers 18a. Exposed gate oxide may also be removed, though the gate dielectric 14 remains protected under the nMOS gates 16a and under the mask 20.

Figure 5:
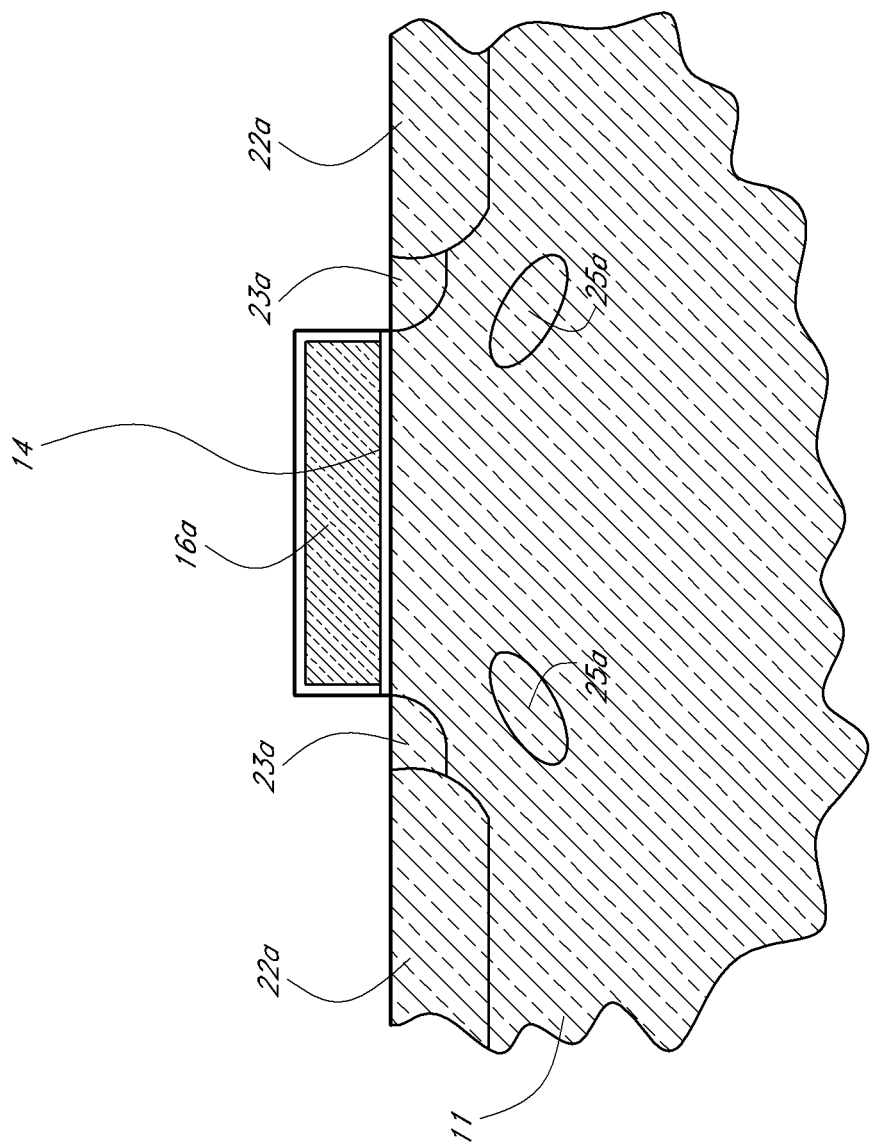
FIG. 5 illustrates a schematic cross-sectional view of the nMOS region of the device of FIG. 4 after LDD implant and Halo implant.

After removal of the disposable spacers 18a, and with the same mask 20 in place, various doping steps may then be performed in the region between the n-channel gate 16a and its source and drain regions 22a in supplemental doping steps 120 (FIG. 1), which can also be referred to as source/drain extension or transistor tailoring implants. With reference to FIG. 5, in one embodiment, as will be well understood in the art, a lightly doped drain (LDD) 23a may be implanted between these structures, on either side of the n-channel gate 16a. As illustrated in the schematic cross-section of FIG. 5, the LDD 23a preferably abuts the source and drain regions 22a and extends substantially adjacent a top surface of the substrate 11. In a preferred embodiment, a Halo implant 25a, or pocket implant, may also be implanted substantially underneath the LDD 23a and the n-channel gate 16a, as illustrated in FIG. 5. The Halo implant 25a is formed on either side of the gate 16a and is more deeply submerged within the substrate 11.

The LDD 23a and Halo implants 25a may be provided over the entire exposed surface of the periphery of the memory device 10, but, since these implants are created using much lower doping levels than those used to form the transistor elements, they are "washed out" by the higher doping of previously doped regions, and thus do not change the semiconductor characteristics of these elements.

In another preferred embodiment, the spacers 18a may not be completely removed in a single step, as disclosed in step 118. Instead, the spacers 18a may be removed in multiple steps. This preferred embodiment enables a grading of the LDD implants 23a, with lower levels of doping in later steps, as the regions closer to the n-channel gates 16a are revealed. In other words, a first portion of the spacers 18a may be removed, and a first level of doping may be used to form the LDD implant 23a. A second portion of the spacers 18a may then be removed, and a second level of doping may be used to form the LDD implant 23a. Preferably, this second level of doping is at a lower level than the first level of doping, such that the doping trails off as the LDD implant 23a approaches the gate 16a. This process may be iterated until the spacers 18a are entirely removed, or until the LDD implant 23a is completely defined. This may improve the overall performance of the device 10.

Thus, source/drain, enhancement and supplemental (e.g., LDD and Halo) doping for the nMOS regions are all performed using a single mask due to employment of disposable spacers. This is indicated in FIG. 1 by the dotted box 140.

In step 122 (FIG. 1), the pMOS mask 20 is then removed, and a new, nMOS mask 24 (FIG. 6) created, opening access to the pMOS regions 13b of the periphery. This is the sixth mask used in the process described herein. The remaining steps disclosed in FIG. 1 (steps 124-132) are illustrated generally in FIGS. 6 and 7. As illustrated, these steps are very similar to steps 112-120, discussed above. The major differences are as follows. First, the dopant types are opposite. For example, instead of using dopants to create n-type source/drain regions, p-type semiconductor doping is performed, preferably using boron. Second, as discussed above, the partial etch back or trim of the spacers 18b over the p-channel gates 16b (step 124) will preferably be eliminated or reduced, relative to the pull back described above with respect to the n-channel gates 16a. In one particular embodiment, the spacers 18 (FIG. 1) may initially be deposited to match the desired effective channel length for the p-channel gates 16b, and a spacer trim need only be performed on the n-channel gates 16a. In another embodiment, the spacers 18b surrounding the p-channel gates 16b will simply be trimmed less than the spacers 18a surrounding the n-channel gates 16a, thereby creating an effective channel length differential between the pMOS and nMOS regions of the device 10.

Thus, gate, source/drain, enhancement and supplemental (e.g., LDD and Halo) doping for the pMOS regions are all performed using a single mask due to employment of disposable spacers. This is indicated in FIG. 1 by the dotted box 150.

Figures 7, 8:
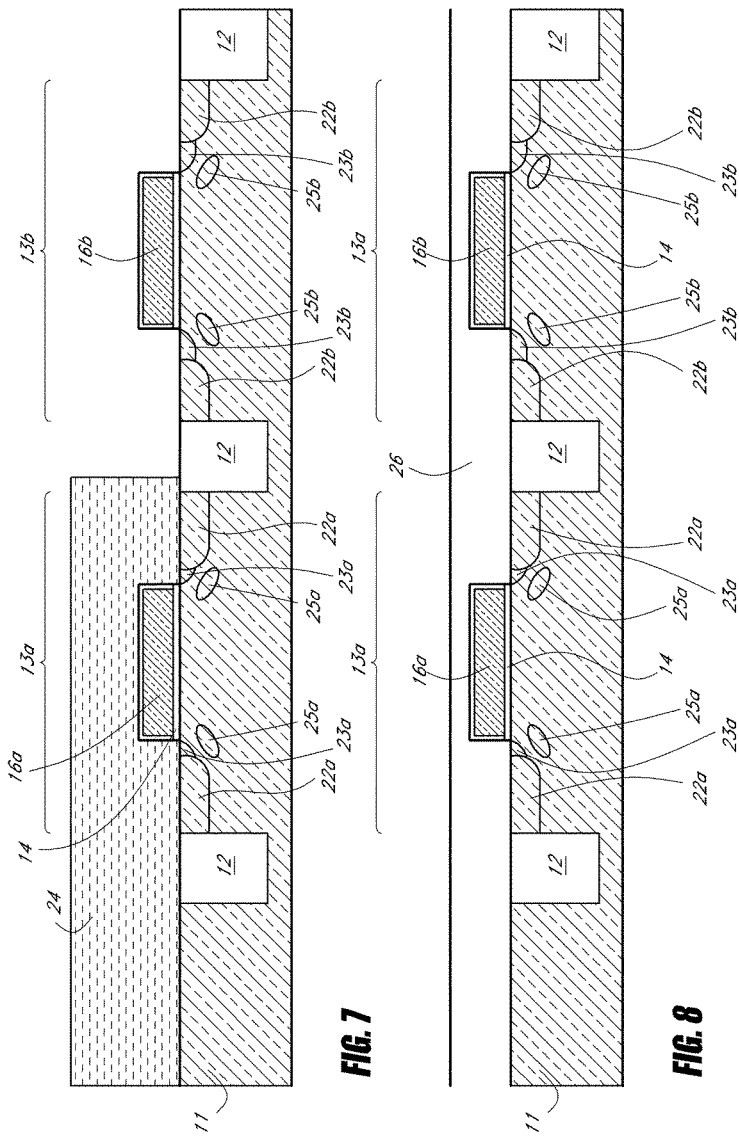
FIG. 7 illustrates a cross-sectional view of the device of FIG. 6 after spacer removal in p-channel areas, LDD implant and Halo implant.
FIG. 8 illustrates a cross-sectional view of the device of FIG. 7 after mask removal, low k gap-fill oxide and RTP.

In FIG. 8, it may be seen that, after the processing of the respective pMOS and nMOS regions has been completed and after removal of the nMOS mask 24, traditional processing steps may be performed. In one embodiment, new spacers may be formed, around the various circuit elements in the periphery in order to facilitate the formation of self-aligned contacts. Because of the sequence employed, the spacers can be oxide rather than traditional silicon nitride spacers, which exhibit high parasitic capacitance due to higher permittivity and also introduce stress.

More preferably, as illustrated, spacers can be omitted in the final product. Instead, as shown, a low k gap fill oxide 26, with a permittivity preferably less than about 3.5 and more preferably less than about 3.2, is deposited along the top of the memory device 10 directly over conductive sidewalls of the gates 16. Preferably the gates 16 comprise silicon, but it is also contemplated that the gates may be formed of other materials or may have a thin conductive coating.

Figure 9:
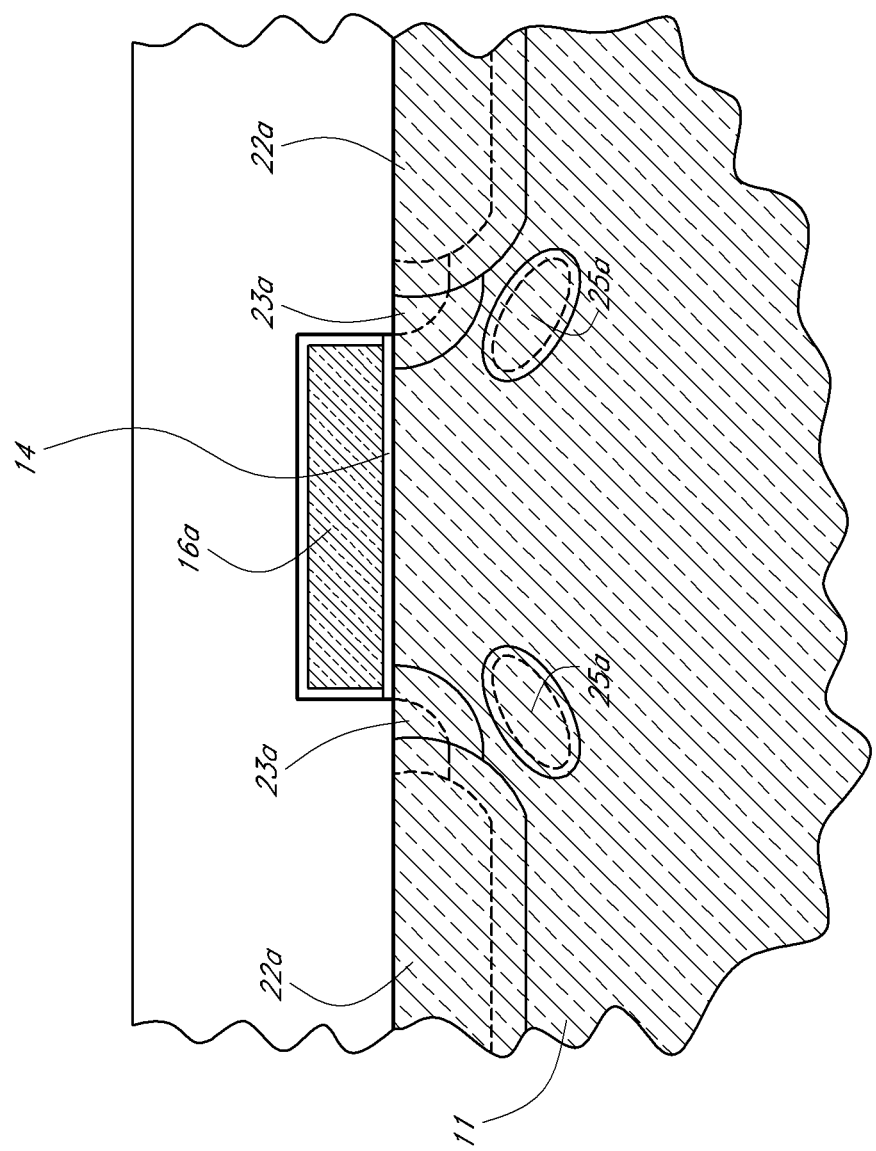
FIG. 9 illustrates a schematic cross-sectional view of the nMOS region of the device of FIG. 8 after dopant activation and consequent diffusion.

With reference now to FIG. 9, thereafter the device 10 may undergo annealing (e.g., rapid thermal processing) for dopant activation. This is preferably conducted after forming the gap-fill oxide 26 and can serve to simultaneously densify the oxide 26. As illustrated, dopant activation also drives the dopants from their original locations. In FIG. 9, the original implanted locations of FIG. 5 are illustrated by dotted lines, and the post-activation positions are indicated by solid lines. It will be understood that the pMOS transistors likewise experience the same activation/dopant diffusion during the anneal. The transistors and other circuit elements of the periphery are thereby defined, and lines may be connected thereto according to other steps well known to those of skill in the art. At this or at earlier stages of wafer processing, the array of the memory device 10 may be defined according to various conventional techniques.

Referring again to FIG. 8, the resultant CMOS circuit can have one or more of the following distinguishing features. While the CMOS gates 16a, 16b of the illustrated embodiment have the same width, the channel defined between source and drain regions 22a, 22b are different, with the p-channel being longer than the n-channel, preferably more than 10% longer, particularly 10-30% and more particularly 15-20% longer on the pMOS side as compared to the nMOS side. A low k gap-fill material directly contacts gate sidewalls, reducing gate-to-drain Miller capacitance. Furthermore, despite the lack of spacers in the illustrated final product, distinct LDD regions are initially formed between source/drain regions and the gate corners (rather than under the gate corners), and later dopant activation (see FIG. 9) cause the LDD to diffuse to the desired location under the gate corners. The resultant device accordingly has a longer life expectancy than LDD formations exclusively formed under the gate.

As is evident from the steps described above, the mask count for the preferred process is less than that for conventional CMOS processing, thereby simplifying the process. In particular, six masks are employed in the above-described preferred embodiment for the definition of the CMOS in the periphery. Gate, source/drain and LDD/Halo doping can be performed at the same stage with one mask for each of the nMOS and pMOS regions, rather than two for each region, thus saving two masks. In exchange, one mask is lost by using separate masks to pattern the transistor gates in the periphery and in the memory arrays.

Figure 10:
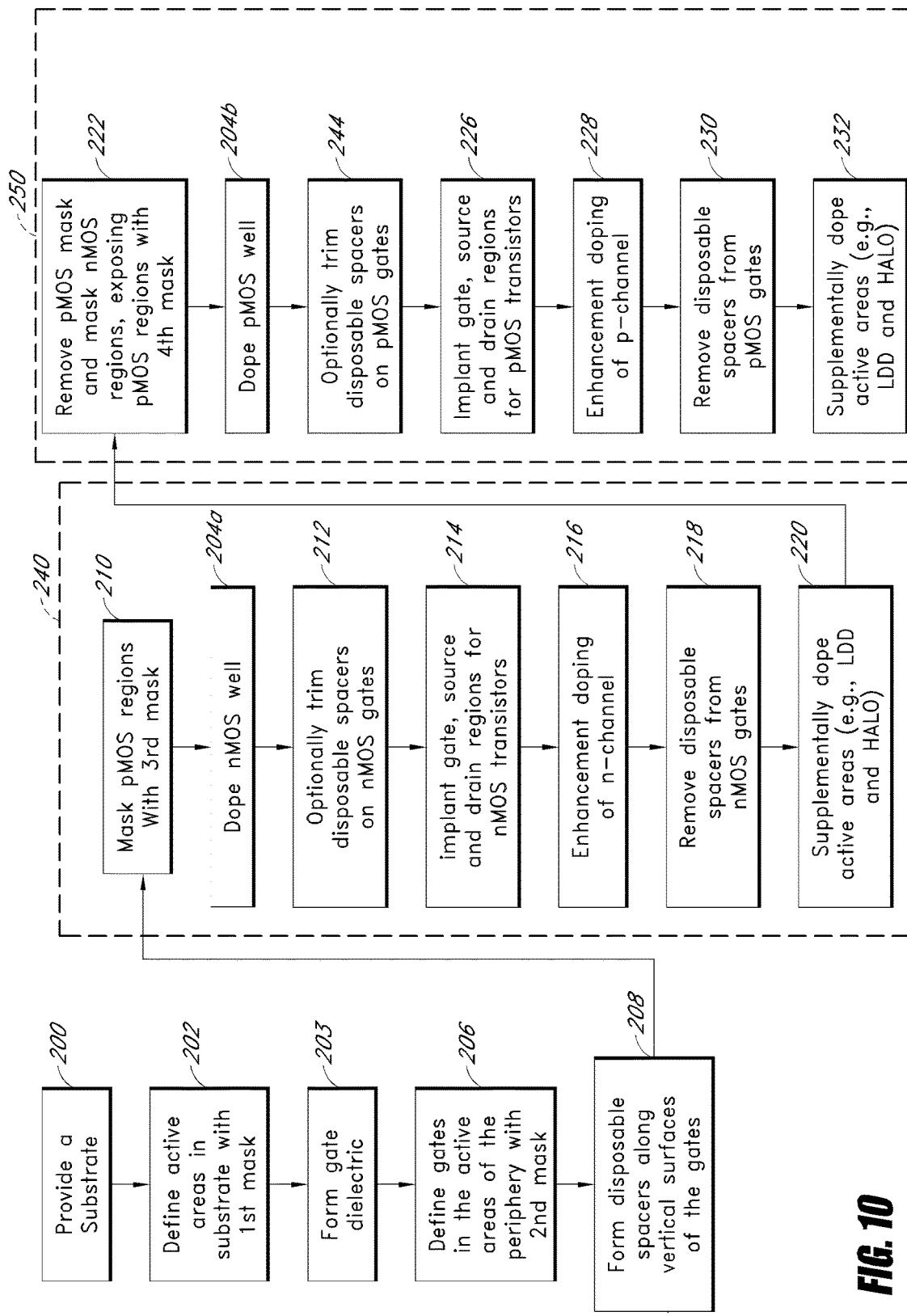
FIG. 10 is a flow chart illustrating a process for fabricating CMOS circuits in accordance with another embodiment of the present invention.

With reference now to FIG. 10, the well implants can also be performed with the same masks, thus saving another two masks. Thus, from STI definition through completion of CMOS transistor definition in the periphery, the process of FIG. 1 employs six (6) masks, while the process of FIG. 9 employs four (4) masks. In FIG. 10, similar steps to those of FIG. 1 are referenced by similar numbers in the 200 range, rather than the 100 range.

As will be appreciated by a comparison of FIG. 1 with FIG. 10, the processes are very similar, except that the well doping steps 204a, 204b are now performed using the same masks used for gate, source/drain, enhancement and supplemental (LDD and Halo) doping. Traditionally, doping of the wells is conducted early in the fabrication process, such that subsequent heat steps can be used to help drive dopants to their ultimately desired depth. However, two factors have recently facilitated doping the wells with the same masks used for source/drain and other doping. The junction depths have become more shallow, and the background doping level (indeed, all doping levels) have increased relatively. Thus, with higher background (well) doping levels, greater crystal faults can be tolerated. Accordingly, state-of-the-art transistor standards enable joinder of well doping with the remaining doping steps for the transistors. Thus, a single mask can be employed for all transistor doping steps for nMOS (see box 240 in FIG. 10) and a single mask for all transistor doping steps for pMOS (see box 250 in FIG. 10).

Significantly, the spacers in place during source/drain doping, which define channel length, can be tailored for nMOS versus pMOS regions without additional masks.

In addition, the manufacturing efficiency for the above process is improved over conventional techniques because higher dose implants may be used. The performance of the CMOS devices may also be improved, with increased mobility and decreased body-effect, or reduced doping can attain the same device performance, as a result of postponing the enhancement and Halo implants until near the end of the process flow, such that reduced dopant diffusion occurs. The gate-to-drain Miller capacitance is also preferably lowered (resulting in faster circuits) because a densified high k dielectric, such as silicon nitride, need not be used for a spacer. Instead an oxide can be used as a spacer, or only the planarized oxide 26 can insulate, as illustrated. Because logic regions of memory devices are not as crowded as the array regions, contacts formed to source and drain regions need not be self-aligned; rather, the contacts vias can be opened in the planarized oxide 26 in a manner spaced from the conductive gate sidewalls, such that only the low k, gap-fill oxide 26 intervenes between the contact and the sidewalls of the gates 16a, 16b.

Of course, the devices may also be made more reliable because of the independent spacer tailoring, and thus tailoring the location of doping, in pMOS versus nMOS devices. The process flow also facilitates subsequent siliciding (or silicidation) of the top of the CMOS gates, indeed all along the silicon line that forms the gates, without opening contacts through cap layers. Silicidation of the source and drain regions of these transistors is also facilitated.

While certain embodiments of the inventions have been described, these embodiments have been presented by way of example only, and are not intended to limit the scope of the invention. Indeed, the novel process for forming the CMOS may be modified a great deal, may have various omissions, substitutions and changes, and many of the steps may be performed in a different order without departing from the spirit of the invention. The accompanying claims and their equivalents are intended to cover such forms or modifications as would fall within the scope and spirit of the invention.

I claim:

1. A method of fabricating a portion of a DRAM, the method comprising:
   providing a substrate;
   defining an nMOS region and a pMOS region within the substrate;
   simultaneously forming spacers over the gate regions in the nMOS and pMOS regions;
   forming a first undoped gate within the nMOS region and a second undoped gate in the pMOS region;
   masking the pMOS region with a pMOS mask and leaving the nMOS region exposed;
   while the nMOS region is exposed, simultaneously doping the first undoped gate, and source and drain regions within the nMOS region while the pMOS mask covers the pMOS region;

removing the spacers from the gate regions in the nMOS region;

after removing the spacers from the gate regions in the nMOS region, doping the nMOS region with lightly doped drain (LDD) and Halo implants while the pMOS mask covers the pMOS region;

masking the nMOS region with an nMOS mask and leaving the pMOS region exposed;

while the pMOS region is exposed, doping the substrate in the pMOS region to form nMOS wells and subsequently simultaneously doping the second undoped gate, and source and drain regions within the pMOS region while the nMOS mask covers the nMOS region; and doping the pMOS region with LDD and Halo implants while the nMOS mask covers the nMOS region.

2. A method of fabricating a portion of a DRAM, the method comprising:

providing a substrate;

defining an nMOS region and a pMOS region within the substrate;

simultaneously forming spacers over the gate regions in the nMOS and pMOS regions;

masking the pMOS region with a pMOS mask;

doping gate, source and drain regions within the nMOS region while the pMOS mask covers the pMOS region;

doping the nMOS region with lightly doped drain (LDD) and Halo implants while the pMOS mask covers the pMOS region, the doping the nMOS region with LDD and Halo implants while the pMOS mask covers the pMOS region comprising:

doping the nMOS region with a first LDD implant;

etching back a portion of the spacers from the gates in the nMOS region after doping the nMOS region with the first LDD implant; and doping the nMOS region with a second LDD and Halo implants;

removing the pMOS mask;

masking the nMOS region with an nMOS mask;

doping gate, source and drain regions within the pMOS region while the nMOS mask covers the nMOS region; and doping the pMOS region with LDD and Halo implants while the nMOS mask covers the nMOS region.

3. The method of claim 2, wherein the first LDD implant has a higher level of doping than the second LDD implant.

4. A method of fabricating a portion of a DRAM, the method comprising:

providing a substrate;

defining an nMOS region and a pMOS region within the substrate;

simultaneously forming spacers over the gate regions in the nMOS and pMOS regions;

masking the pMOS region with a pMOS mask;

doping gate, source and drain regions within the nMOS region while the pMOS mask covers the pMOS region;

doping the nMOS region with lightly doped drain (LDD) and Halo implants while the pMOS mask covers the pMOS region;

removing the pMOS mask;

masking the nMOS region with an nMOS mask;

doping gate, source and drain regions within the pMOS region while the nMOS mask covers the nMOS region; and doping the pMOS region with LDD and Halo implants while the nMOS mask covers the nMOS region, the doping the pMOS region with LDD and Halo implants while the nMOS mask covers the nMOS region comprising:

doping the pMOS region with a first LDD implant;

etching back a portion of the spacers from the gates in the pMOS region after doping the pMOS region with the first LDD implant; and doping the pMOS region with a second LDD and Halo implants.

5. The method of claim 4, wherein the first LDD implant has a higher level of doping than the second LDD implant.

6. A method of manufacturing an integrated circuit, the method comprising:

providing a substrate;

defining an nMOS region and a pMOS region within the substrate;

doping a first gate over an n-channel in the nMOS region, and a second gate over a p-channel in the pMOS region, the first and second gates having approximately the same widths while the n-channel is shorter than the p-channel;

forming first spacers and second spacers over the first and second gates, respectively;

masking the nMOS and pMOS regions with a nMOS mask and a pMOS mask, respectively;

doping the nMOS and pMOS regions with lightly doped drain (LDD) and Halo implants, respectively, wherein doping the nMOS region is conducted while the pMOS region is masked with the pMOS mask and doping the pMOS region is conducted while the nMOS region is masked with the nMOS mask; and removing the first and second spacers from the first and second gate, respectively.

7. The method of claim 6, further comprising forming a low k gap-fill oxide extending between conductive sidewalls of the first gate and the second gate without the first and second spacers.

8. The method of claim 6, further comprising:

iteratively trimming one or more portions of the first and second spacers while the pMOS region is masked with the pMOS mask and nMOS region is masked with the nMOS mask, respectively; and iteratively doping the nMOS and pMOS regions with a plurality of successive LDD implants, each of the plurality of successive LDD implants is conducted after iteratively trimming each of the one or more portions of the first and second spacers while the pMOS region is masked with the pMOS mask and nMOS region is masked with the nMOS mask, respectively.

9. The method of claim 8, wherein each successive LDD implant has a lower level of doping than the preceding successive LDD implant.

* * * * *